US007653845B2

(12) United States Patent
Hesse et al.

(10) Patent No.: US 7,653,845 B2
(45) Date of Patent: Jan. 26, 2010

(54) TEST ALGORITHM SELECTION IN MEMORY BUILT-IN SELF TEST CONTROLLER

(75) Inventors: Siegfried Kay Hesse, Dresden (DE); Markus Seuring, Dresden (DE); Thomas Herrmann, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 417 days.

(21) Appl. No.: 11/484,157

(22) Filed: Jul. 11, 2006

(65) Prior Publication Data
US 2007/0204190 A1 Aug. 30, 2007

(30) Foreign Application Priority Data
Feb. 28, 2006 (DE) ................ 10 2006 009 224

(51) Int. Cl.
*G11C 29/00* (2006.01)
(52) U.S. Cl. .................. 714/718; 714/733
(58) Field of Classification Search ............. 326/93; 714/732, 30, 29, 718, 733, 724, 730
See application file for complete search history.

(56) References Cited

U.S. PATENT DOCUMENTS

| 5,051,996 | A  | * | 9/1991  | Bergeson et al. ............ 714/732 |
|-----------|----|---|---------|-------------------------------------|
| 6,085,334 | A  |   | 7/2000  | Giles                               |
| 6,286,116 | B1 |   | 9/2001  | Bhavsar                             |
| 6,510,530 | B1 | * | 1/2003  | Wu et al. ...................... 714/30 |
| 6,550,032 | B1 | * | 4/2003  | Zhao et al. .................. 714/730 |
| 6,614,263 | B2 | * | 9/2003  | Nadeau-Dostie et al. ...... 326/93   |
| 6,961,871 | B2 | * | 11/2005 | Danialy et al. ................ 714/30 |
| 6,966,017 | B2 | * | 11/2005 | Evans ......................... 714/718 |
| 7,159,145 | B2 |   | 1/2007  | Wang                                |
| 2005/0204231 | A1 | * | 9/2005 | Mukherjee et al. .......... 714/733 |
| 2005/0204232 | A1 |   | 9/2005 | Seuring ..................... 714/733 |
| 2005/0223288 | A1 | * | 10/2005 | Berbaum et al. ............. 714/29 |
| 2006/0031726 | A1 | * | 2/2006 | Zappa et al. ................. 714/718 |

FOREIGN PATENT DOCUMENTS

WO        97/04459 A1   2/1997
WO     2005/013285 A1   2/2005

OTHER PUBLICATIONS

Translation of official communication application No. DE 10 2006 009 224.4-55 issued Jan. 31, 2007.

* cited by examiner

*Primary Examiner*—David Ton
(74) *Attorney, Agent, or Firm*—Meyertons, Hood, Kivlin, Kowert & Goetzel, P.C.

(57) ABSTRACT

An integrated circuit chip is provided that comprises on-chip memory and test circuitry. The test circuitry is configured to perform operational testing of the on-chip memory. The test circuitry comprises a controller which is configured to perform a selection out of a plurality of test algorithms to perform the operational testing. The plurality of test algorithms includes a fault detection test algorithm to perform operational testing of the on-chip memory in order to detect whether or not there is a memory fault, without locating the memory fault. The plurality of test algorithms further includes a fault location test algorithm to perform operational testing of the on-chip memory in order to detect and locate a memory fault. Further, a method to perform a memory built-in self test and an MBIST (Memory Built-In Self Test) control circuit template are provided.

15 Claims, 7 Drawing Sheets

TEST ALGORITHM SELECTION IN MEMORY BUILT-IN SELF TEST CONTROLLER

BACKGROUND OF THE INVENTION

1. Field of the Invention

The invention generally relates to on-chip memory, and more particularly to performing memory built-in self tests.

2. Description of the Related Art

BIST (Built-In Self Test) techniques are sometimes used in developing integrated circuits, in order to reduce the dependency on external automated test equipment. BIST is a design-for-test technique since circuitry is added for design testability. In detail, additional hardware and software features are designed into integrated circuit chips to allow them to perform self testing, that is, testing of their own operation, using their own circuits. The testing may be functionally or parametrically.

Among the BIST techniques, LBIST (Logic BIST) and MBIST (Memory BIST) are distinguishable approaches. LBIST is designed for testing random logic and typically employs a pseudo-random pattern generator. In contrast thereto, MBIST is used specifically for testing memories. Thus, LBIST and MBIST are for testing different kinds of circuits by different kinds of tests.

While conventional MBIST techniques allow reducing the need for external electrical testing using an automated test equipment, the necessity to perform external testing is usually not eliminated and still cumbersome. Thus, conventional MBIST techniques are often not of sufficient effectiveness.

SUMMARY OF THE INVENTION

Memory built-in self-test techniques are provided which have the potential to be more effective and more flexible than conventional techniques, and which improve reliability and efficiency.

In one embodiment, an integrated circuit chip is provided that comprises on-chip memory and test circuitry. The test circuitry is configured to perform operational testing of the on-chip memory. The test circuitry comprises a controller which is configured to perform a selection out of a plurality of test algorithms to perform the operational testing. The plurality of test algorithms includes a fault detection test algorithm to perform operational testing of the on-chip memory in order to detect whether or not there is a memory fault, without locating the memory fault. The plurality of test algorithms further includes a fault location test algorithm to perform operational testing of the on-chip memory in order to detect and locate a memory fault.

In another embodiment, there is provided a method to perform a memory built-in self test. The method comprises receiving an algorithm code identifying one of plural built-in self test algorithms, where the plural built-in self test algorithms include at least one go/no go production test algorithm and at least one fault analysis algorithm. The method further comprises determining the algorithm identified by the received algorithm code. If it is determined that the received algorithm code identifies a go/no go production test algorithm, the identified go/no go production test algorithm is performed. If it is determined that the received algorithm code identifies a fault analysis algorithm, the identified fault analysis algorithm is performed.

According to still a further embodiment, a computer readable medium is provided which comprises a data structure which is operated upon by a program executable on a computer system. The program operates on the data structure to perform a portion of a process to design an integrated circuit including circuitry described by the data structure. The circuitry described in the data structure includes an MBIST control circuit configured to be implemented in a memory device design to add MBIST functionality to the memory device to be designed. The data structure comprises circuitry definitions that, when implemented into the design, provide the memory device with one or more pass/failure decision test functions. The data structure further comprises circuitry definitions that, when implemented into the design, provide the memory device with one or more failure diagnosis functions. Further, selector circuitry definitions are comprised that, when implemented into the design, enable the memory device to perform a selection of one or more functions out of said pass/failure decision test functions and said failure diagnosis functions.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention, as illustrated in the accompanying drawings, wherein.

DETAILED DESCRIPTION OF THE INVENTION

The illustrative embodiments of the present invention will be described with reference to the figure drawings wherein like elements and structures are indicated by like reference numbers.

As will be described in more detail below, embodiments allow for flexibly selecting MBIST algorithms at test time and/or allow for providing for specific modes for fast production test (pass/fail decision, good/no good decision, or go/no go decision) and fault diagnosis (exact mapping of the failure).

Embodiments may apply various approaches for operational testing. It is noted that operational testing may include functional testing and/or parametrical testing. Functional testing is a form of testing that attempts to determine whether each function of the system works as specified. Parametric tests are tests that measure the value of a parameter on the output or a particular point of an assembly.

In an embodiment, an MBIST controller is provided that may incorporate design-for-test principles and that may enable product testing for embedded RAM (Random Access Memory) arrays. In an embodiment, the embedded RAM arrays have up to four Giga-words ($2^{32}$) with a maximum of 1024 bits each and optional write masks with a maximum granularity of one bit. The MBIST controller of the embodiments may support MBIST algorithms that give good fault coverage on all essential faults that embedded arrays can exhibit. It is however noted that the embodiments are not restricted to the use of embedded RAM arrays.

The MBIST controller of the present embodiment may be designed as a template that can be easily adapted to single-port and two-port RAMs of arbitrary sizes and data widths using only minimal hardware resources. In addition, the MBIST controller may be adapted to dual-port RAMs, i.e., RAMs with two independent read/write ports with optional write masks. The template may be provided as medium storing computer readable instructions that, when executed by a processor, cause the processor to incorporate the respective circuit definitions into a memory device design to implement the template.

As will be described in more detail below, the MBIST controller of the embodiments may support several levels of test: fast production testing, comprehensive production testing, fault analysis, and fault debugging.

Fast production testing is intended to detect the most frequent types of faults. This allows for a quick good/no good selection of chips and is not intended to locate any fault, and the embodiment may not even be capable of doing so.

Comprehensive production testing is also directed to detecting all important types of faults. Although this testing might be slightly slower than the fast production testing, it can be used for a more rigorous sieving of chips.

Fault analysis is an algorithm (or an execution mode of an algorithm) that may be used to not only detect but also locate the most common types of faults. This algorithm is therefore a diagnosis test that takes more time but yields much more information.

Finally, fault debugging is a mode where test software has complete control over the operation and can step through the algorithms or even use data/address patterns not supported by built-in algorithms.

Thus, the embodiments allow for performing a selection out of a plurality of test algorithms which include one or more fault detection test algorithm (fast production testing, comprehensive production testing) and one or more fault location test algorithm (fault analysis, fault debugging). The selection may be done at test time, and algorithms solely for fault detection as well as algorithms for additional locating a fault can be selected.

Thus, the MBIST controller may have built-in algorithms to locate stuck-at faults in the address decoder and the array, locate stuck-open faults in the RAM's address decoder, and/or further detect transition faults in the array, coupling faults in the array and linked coupling faults in the array.

It is noted that the actual memory test can be done either separately or concurrently to an ongoing scan. A technique to perform a simultaneous scan test and memory test is described in US 2005/0204232 A1 which is incorporated herewith by reference in its entirety.

In an embodiment, test equipment or bring-up software can access the MBIST controller in different ways: In normal scan mode, MBIST control registers are part of the scan chain and can be loaded during shift cycles with the desired values.

In another mode, the MBIST controller may further have a data register interface that allows for its control registers to become a virtual data register of the SoC's (System on a Chip) TAP (or test) controller. If there are multiple MBIST controllers in the system, then these can either be assigned their individual data register interface data registers or some or all MBIST controllers may be chained to form one big data register. In yet another optional mode, the SoC designer may use a simple parallel interface to the MBIST controller to allow access to it through normal software visible registers.

Figure 1:
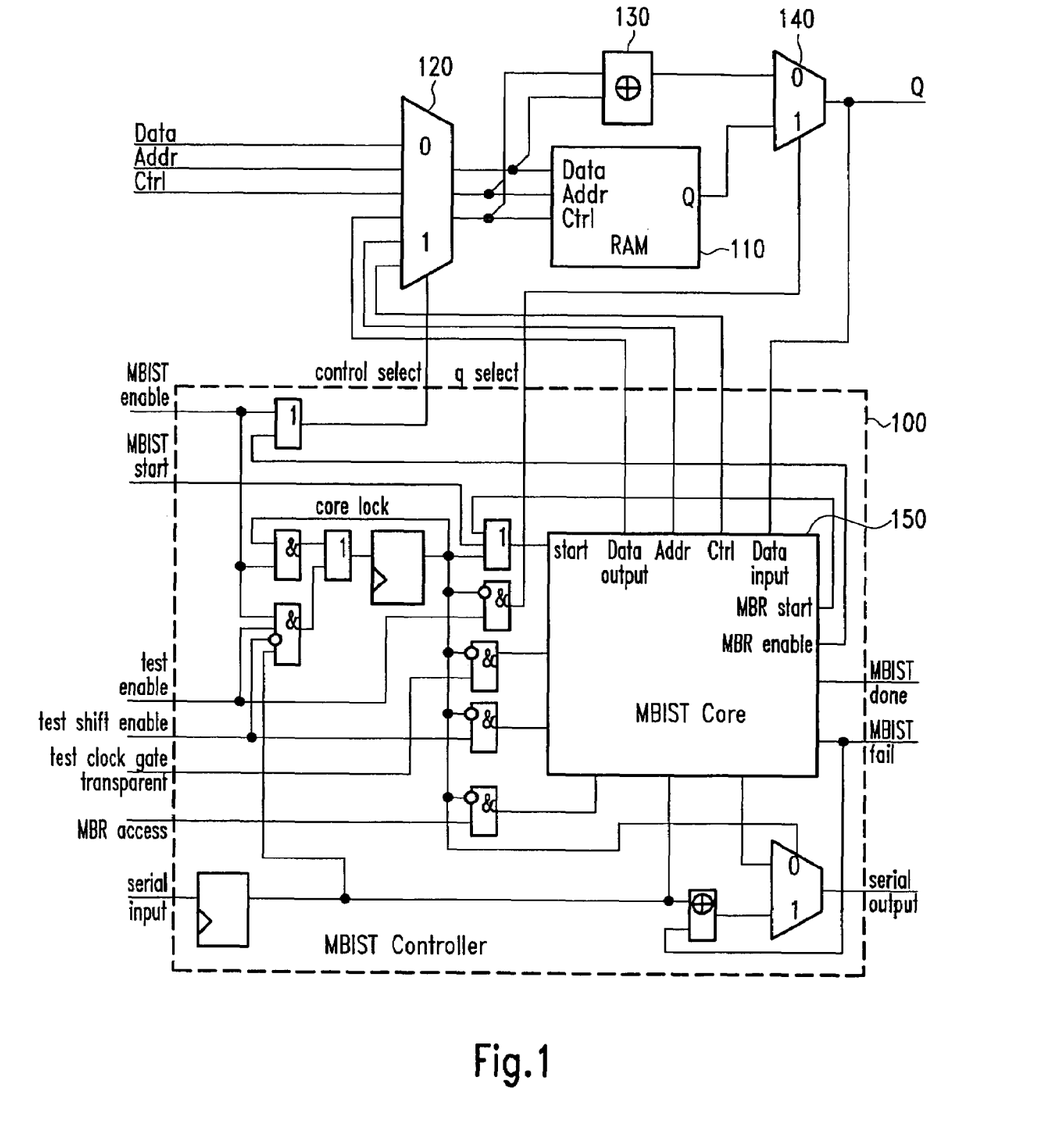
FIG. 1 is a block diagram illustrating an MBIST technique according to an embodiment.

Referring now to FIG. 1, an MBIST system overview according to an embodiment is provided, to show how the MBIST core fits into the test strategy, thereby allowing Scan and MBIST either separately or concurrently. The actual MBIST controller is shown as block 100 and includes the MBIST core 150. The memory is depicted as block 110, and this memory may be a single-port RAM, a two-port RAM, a dual-port RAM, any other kind of on-chip memory, and in particular any kind of embedded memory (i.e., on-chip memory which is only accessible from within the integrated circuit chip). As can be seen, the output Q of multiplexer 140 is fed into the MBIST core 150, and the output (Data, Addr, Ctrl) of the MBIST core 150 is fed into multiplexer 120. Multiplexers 120 and 140 are controlled by the MBIST controller 100 using the control select signal and the q select signal, respectively.

There is further provided an XOR bypass 130 which may be used in the MBIST context but which may be also used with RAM's without MBIST. The bypass 130 may increase the scan coverage. In an embodiment, there may be no bypass 130, and then there might be no need for multiplexer 140 to be controlled by the q select signal.

Figure 2:
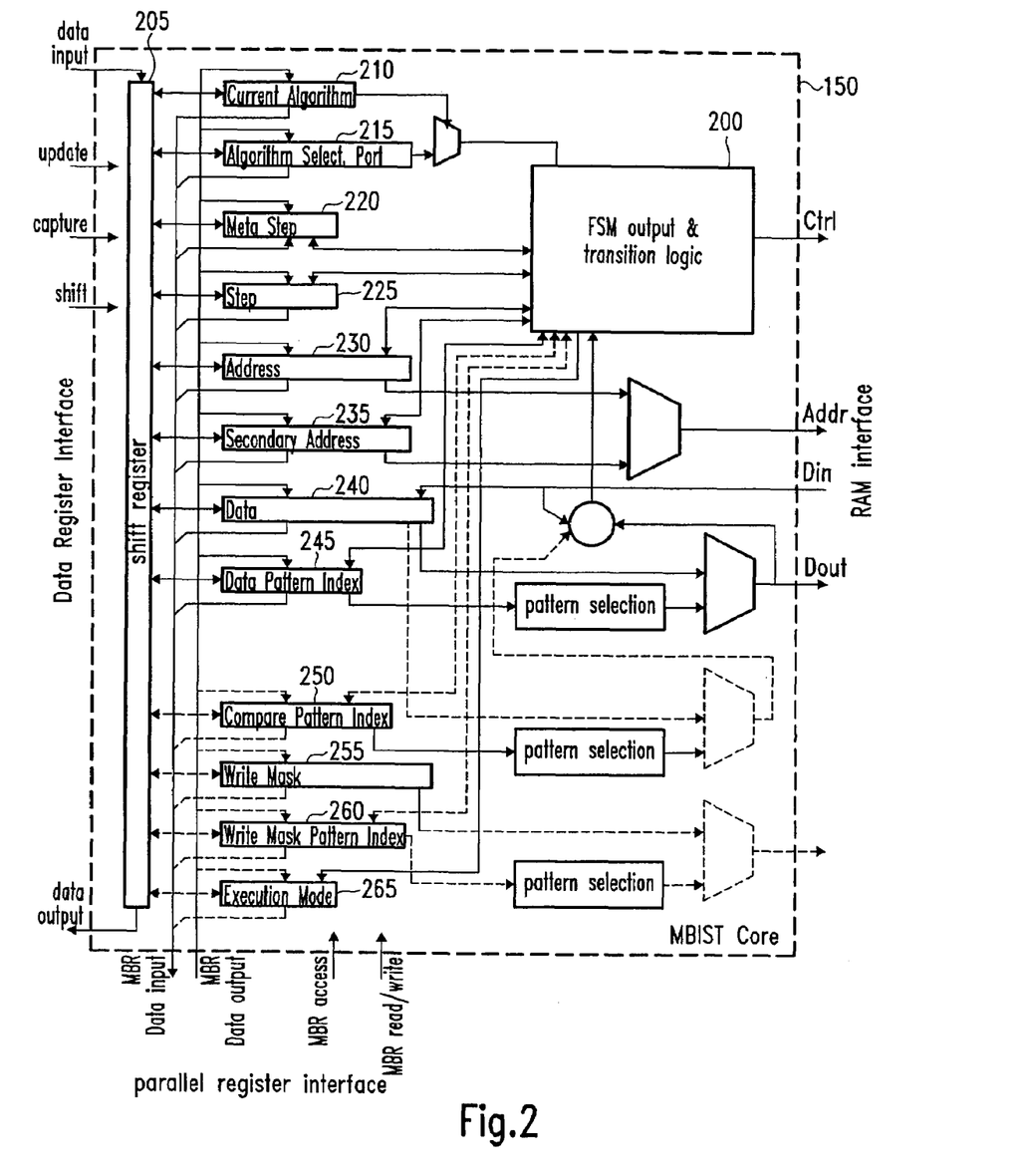
FIG. 2 is a block diagram illustrating the MBIST core which is a component of the system shown in FIG. 1, according to an embodiment.

FIG. 2 is a block diagram illustrating in more detail the components of the MBIST core 150 shown in FIG. 1. As can be seen, there is a data register interface on the left side of the block, and a parallel register interface at the bottom. These are the interfaces mentioned above when discussing the modes of accessing the MBIST controller.

As can be further seen from FIG. 2, there are a number of operational registers such as a current algorithm register 210, an algorithm select/port register 215, a meta step register 220, a step register 225, an address register 230, a secondary address register 235, a data register 240, a data pattern index register 245, a compare pattern index register 250, a write mask register 255, a write mask pattern index register 260, and an execution mode register 265. It is noted that not all of these registers are mandatory and any potential combination and sub combination of registers may be present in various embodiments.

In the following, control and status features of MBIST execution will be described in more detail with reference to FIGS. 1 and 2.

It was described above that test equipment can access the MBIST controller in a normal scan mode. In this mode, the test enable and test shift enable signals shown in FIG. 1 are used. In detail, in the normal scan mode, the MBIST controller 100 itself is tested. The test shift enable signal switches between shift and capture mode.

For data register interface capture, the MBIST controller's operational registers 210-265 are copied into the shift register 205. The controller is not paused in case an algorithm is just running.

For data register interface update, the controller's operational registers 210-265 are loaded with the values from the shift register 205. If an algorithm is running concurrently it will be paused during the update cycle and then continue with the newly loaded controller state.

The MBR (MBIST register) access and MBR read/write signals may be used to control register parallel read and write access modes. In the register parallel read access mode, the controller's registers are read out over the parallel interface. This reading is non-disturbing, i.e., the controller can concurrently execute an MBIST algorithm. The register parallel write access mode is used to write to the controller's registers over the parallel interface. While in this mode, an ongoing MBIST algorithm is paused.

The core start signal which is provided to the MBIST core 150 may be used to load default values into status and control registers.

Further, a falling edge of the MBIST enable signal may cause the MBIST done and fail signals which are status signals to be reset to 0.

When the MBIST enable signal is asserted and the MBIST core 150 receives a start signal, then the controller will proceed to start or resume or step through an MBIST algorithm depending on the value of the execution mode register 265 and the state of the MBIST fail signal. In detail, according to an embodiment, if the execution mode is 0, 1 or 2 and the MBIST fail signal is 0, the algorithm will be started. If the execution mode is 0 or 1 and the MBIST fail signal is 1, the algorithm will be resumed without repair step. If the execution mode is 2 and the MBIST fail signal is 1, the algorithm will be resumed after a repair step. If the execution mode is 3, then the next step of the algorithm will be executed if the MBIST fail signal is 0, or the repair step is executed otherwise.

In case the test enable signal and the MBIST enable signal are asserted, then Scan and MBIST will be done concurrently. Once the core start signal has become asserted, the MBIST controller will not participate in normal scan shifting and capturing.

During and after execution, test equipment may be informed about the global MBIST state using two status signals, MBIST done and MBIST fail. In the neutral state, both signals are deasserted. The neutral state is taken when either MBIST is deactivated or the controller is currently executing an algorithm and has neither finished nor hit a fault.

If MBIST done is deasserted but MBIST fail is asserted, the controller has hit a fault before the algorithm was finished. The algorithm is therefore halted and the controller status is kept for status to read out. If MBIST done is asserted and MBIST fail deasserted, MBIST is completed. The controller has successfully finished the test. Finally, if both signals are asserted (which may occur only in specific execution modes), the failure happened during the final read operation of the algorithm.

In the embodiments, the controller's registers 210-265 can be accessed in different ways: via the parallel register interface, via the data register interface, and via scan shift.

If the controller's registers are accessed via the parallel register interface, the register settings can be changed in a convenient way. This access mode can be used on automatic test equipment as well as in a system. The parallel register interface can be used to, e.g., insert the controller's register set into a module register space.

If access is done via the data register interface, all MBIST registers can be accessed as (part of) a TAP controller data register. When the capture signal at the data register interface is asserted, the state of the operational registers is copied into the shift register 205. Captured data is shifted out (and new data shifted in) when the shift signal at the data register interface is active. When the update signal is asserted, the controller's operational registers are loaded with the values from the shift register 205.

If access is done via scan shift, all MBIST registers are part of normal scan chains and can thus be written new values by shifting these in. In an embodiment, this may be done during automated test equipment testing. The actual position of a specific register within the scan chain may be determined during synthesis and must be known to access the registers. Further, MBIST control registers may be arbitrarily intermingled with internal flip-flops of the surrounding circuitry.

To start built-in algorithms, the registers are preloaded by test equipment in a predefined manner. The registers involved may be the algorithm select register 215, the meta step register 220, the step register 225, the address register 230, the secondary address register 235, the data register 240, the data pattern index register 245, and the execution mode register 265. It is noted that in other embodiments, not all of these registers, and/or further registers may be used for this purpose. In an embodiment, the built-in algorithms may include one or more of the following algorithms: MarchB, MATS+, Walking 0/1, SOAF, and SOWM.

In the embodiments, there may be multiple test scenarios: scan test, parallel execution of Scan and MBIST, MBIST operation, and execution of non-built in algorithms.

In the scan test scenario, the MBIST controller 100 itself is tested using the usual shift and capture cycles. Test equipment may set this mode by activating the test enable signal and may use the test shift enable signal to switch between shift and capture cycles. It may be assumed that the signals MBIST enable, MBIST start, test enable and test shift enable are controlled directly (not over a scan chain) by test equipment, e.g., by a TAP controller. All other inputs can originate in normal functional logic and may be controlled through scan chains.

This scenario may ensure optimum scan coverage since the functional RAM inputs (Data, Addr, Ctrl) can be observed using the XOR bypass 130 shown in FIG. 1. The functional stages driven by the RAM output can be controlled by using this bypass. Further, the data input port of the MBIST core 150 can be controlled in that way. In addition, further MBIST core inputs are controllable. All internal MBIST registers (including the data register interface shift register 205) are controllable and observable using a scan chain. Since the MBIST core outputs (Data, Addr, Ctrl) are controllable this way, functional circuitry following Q can also be controlled. Finally, when the MBIST enable signal is set dominantly by test equipment, the MBIST outputs (Data, Addr, Ctrl) are observable through the XOR bypass 130. It is noted that the core lock register must not be part of a scan chain. It is further noted that the register storing the serial input data is not set to 1 during capture cycles when also MBIST enable is set to 1. Otherwise, the MBIST controller 100 will lock itself out of the normal scan and go into parallel Scan/MBIST mode.

The parallel execution of Scan and MBIST scenario is entered when test equipment has set both the serial input and the MBIST enable signals to 1 while the test enable signal was asserted. It is noted that the test equipment can set the MBIST enable signal dominantly so it cannot be inadvertently got deasserted during a scan shift operation. On this condition, the MBIST core 150 will lock itself out of the normal scan chain, the core will leave scan mode and commence the MBIST algorithm. This mode may only be left after the controller has finished the algorithm (either by completion or fail). The MBIST enable signal is deasserted. Test equipment may use normal scan shifting to set up the MBIST core before starting the algorithm.

From the MBIST core's point of view, this scenario is just like normal MBIST operation as described below. From outside, the mode is like normal scan operation except for the limitations in controllability and observability explained above.

As to the MBIST operation scenario, in principle, each algorithm may be executed by the controller's FSM (Finite State Machine) 200 by following the steps laid out in the respective algorithm. The finite state machine 200 stops on detection of a fault. At this moment, software can read out that status and thus get information on the fault location. However, if read pipelining is used, the state read out will already be that in the next step of the algorithm. Read pipelining refers to a technique which begins executing a second RAM access before a preceding read has been completed. That is, the memory loads requested memory contents into a small cache and then immediately begins fetching the next memory contents. In the embodiments, read pipelining may be controlled with the settings of the execution mode register 265.

Further, software can also preload the finite state machine registers with values and subsequently start the finite state machine 200 in the middle of an algorithm.

One mode of MBIST operation is the fast production test already mentioned above. In this test, emphasis is put on a fast good/no good decision for the device under test. An algorithm may be chosen that will give good coverage within a reasonable run time (e.g., MarchB). The execution mode register 265 will be set to "normal". Test equipment starts the MBIST test either separately or in parallel to Scan. Once started, the algorithm will run and stop only on completion or first fault. For increased speed, read pipelining may be used. Although test equipment could read out the status after completion, the main interest is not in fault location. In an embodiment, the mode can be modified to disable status read out. Test equipment can use data register interface shift operations to read or to set a new control register value although this is not the main focus of the test. Test equipment can also restart the MBIST controller after a fail, however, there may be no repair step, so there might be a high probability that the MBIST operation will fail again soon. Again, these features may be disabled in an embodiment.

Another MBIST operational test may be the burn-in test for comprehensive production testing. In this scenario, the parallel Scan/MBIST feature is used to exercise the circuit to the maximum extent. The execution mode register 265 may be set to "continuous" so the algorithm keeps running and stops only when a fault is detected. Read pipelining can be used for maximum throughput through the RAM. Like for the production tests, emphasis is put on fault detection, although test equipment can read out the state after a fail. Similar to the fast production test, this functionality may be absent in alternative embodiments.

Another MBIST operational test mode is fault diagnosis. In this mode, emphasis is put on detecting all faults, and, depending on the algorithm, locating the faults. Run time is of less concern. Further, some semi-automatic/manual reaction on the MBIST status may be required by the test equipment. The execution mode register 265 may be set to "diagnosis" (alternatively "single step"). This may cause the MBIST controller 100 to not use read pipelining which allows repair steps on fault detection. Once started, the MBIST controller may execute the algorithm to the first detection of a fault and then stop. Test equipment can then read out the MBIST status (via the data register interface or the parallel register interface). With the next rising edge on the MBIST start signal, the controller may first insert a repair step (i.e., write the expected value to the failed location) and then resume the normal algorithm. It will stop on the next fault. Test equipment can thus cycle through all fault locations and log them. The algorithm is finished when the controller asserts the MBIST done signal. The next rising edge on the MBIST start signal will start the algorithm all over again.

It is noted that test equipment can solve the issue of deterministic timing behavior versus reaction on random faults by cycling through a test loop that starts or restarts MBIST operation, waits for the maximum time to complete for the selected algorithm, read out that status and then decide on the value of the MBIST fail signal to reiterate that loop. This decision may need some semi-automatic reaction.

In yet another MBIST operational mode, a single step test can be done, e.g., for debugging. This mode may be used for fault diagnosis like the mode described above. The single step test mode is even possible manually, e.g., by setting registers interactively. In addition to that, it can be used to execute MBIST algorithms that are not built into the controller. This mode will take much more time on test equipment and is not meant for production testing.

If a fault occurred and the controller stopped, a new rising edge of the MBIST start signal will cause a repair step instead of executing the next step of the algorithm.

Referring to FIGS. 5 to 9, examples of the MBIST timing are shown in respective timing diagrams. It is noted that the data buses are shown as single lines during times of inactivity for clarification only. In a real design, the bus will keep the previous value. It is further noted that all read enable signals and write enable signals are low-active.

Figure 5:
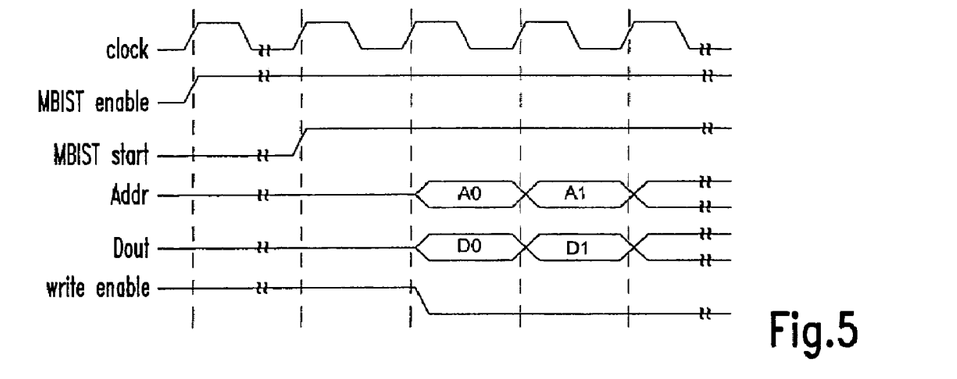
FIG. 5 is a timing diagram illustrating the start-up time according to an embodiment.

FIG. 5 illustrates the start-up timing. The diagram shows that the first (write) access occurs one clock cycle after the rising edge of the MBIST start signal. This is due to the edge detection for that input.

Figure 6:
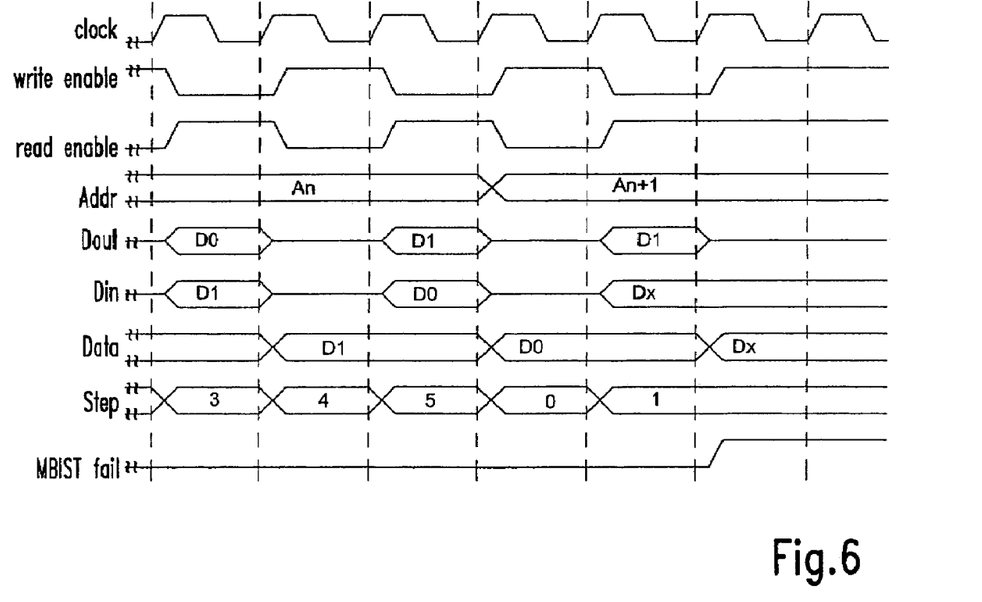
FIG. 6 is a timing diagram illustrating a pipelined operation with a detected fault, according to an embodiment.

FIG. 6 displays the pipelined mode of operation (used when the execution mode is 0 or 1) with a partial view from MarchB. It can be seen how the algorithm advances two cycles (see e.g., Step) before the controller stops on fault detection (the MBIST fail signal gets asserted). However, test equipment may be able to determine the failing data pattern.

Figure 7:
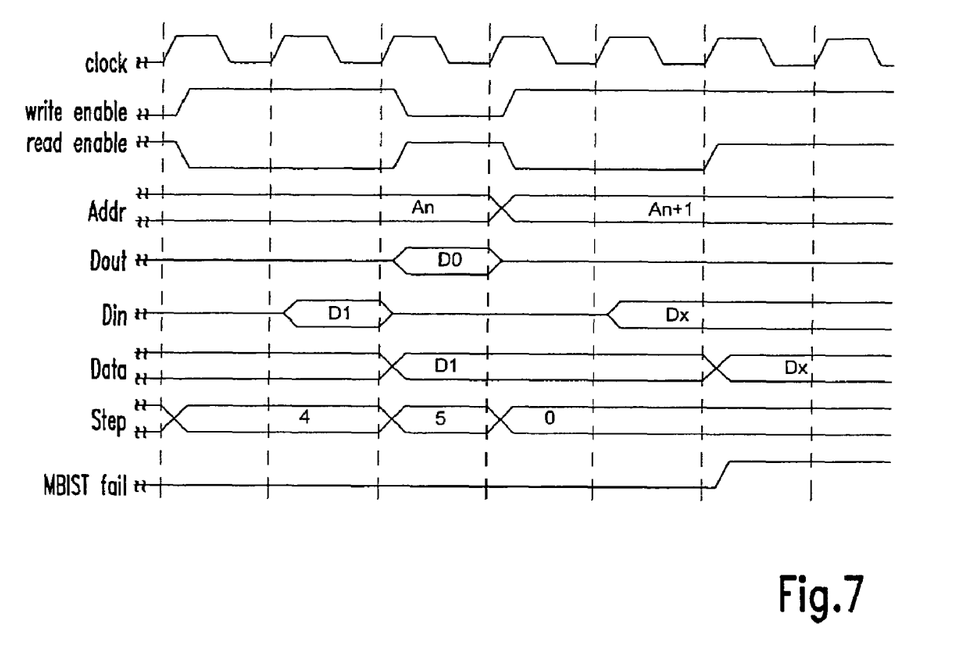
FIG. 7 is a timing diagram illustrating a non-pipelined operation with a detected fault, according to an embodiment.

FIG. 7 shows the non-pipelined mode of operation (used when the execution mode is 2 or 3), once again with a partial view of MarchB. It can be seen how the read step now takes two clock cycles. Further, it can also be seen that the algorithm will not advance when it detects a fault. Thus, all status registers keep the exact position as it was on fault detection.

Figure 8:
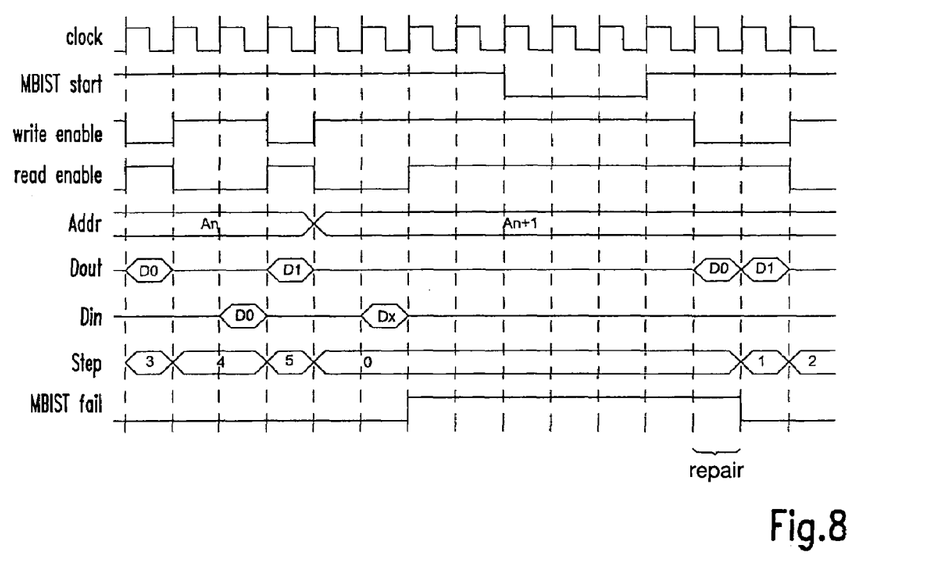
FIG. 8 is a timing diagram illustrating the execution of a repair step after a fault detection, according to an embodiment.

FIG. 8 illustrates the timing and effect of the repair step that is executed in the non-pipelined modes when the controller is restarted after a detected fault. It is noted that the controller registers (e.g., the step register 225) are kept at the value where the fault was detected. Instead of the (previously failed) read, a write operation is executed in the cycle after the restart. The output MBIST fail signal is deasserted after this repair step. However, to avoid a life lock (endless loop) this repair write may be not checked with a subsequent read. Instead, the algorithm may advance to the next step (see e.g., Step).

Figure 9:
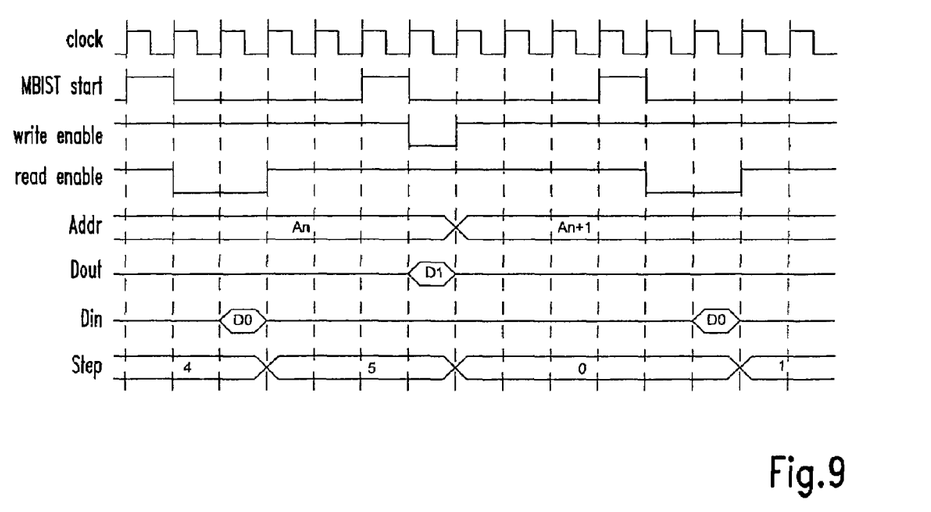
FIG. 9 is a timing diagram illustrating a single step execution.

FIG. 9 shows the single step mode of operation (where the execution mode is 3). One cycle after each rising edge of the MBIST start signal, the algorithmic step according to the current setting of the control registers is executed and the registers are advanced to the next step (cf. Step).

Figure 3:
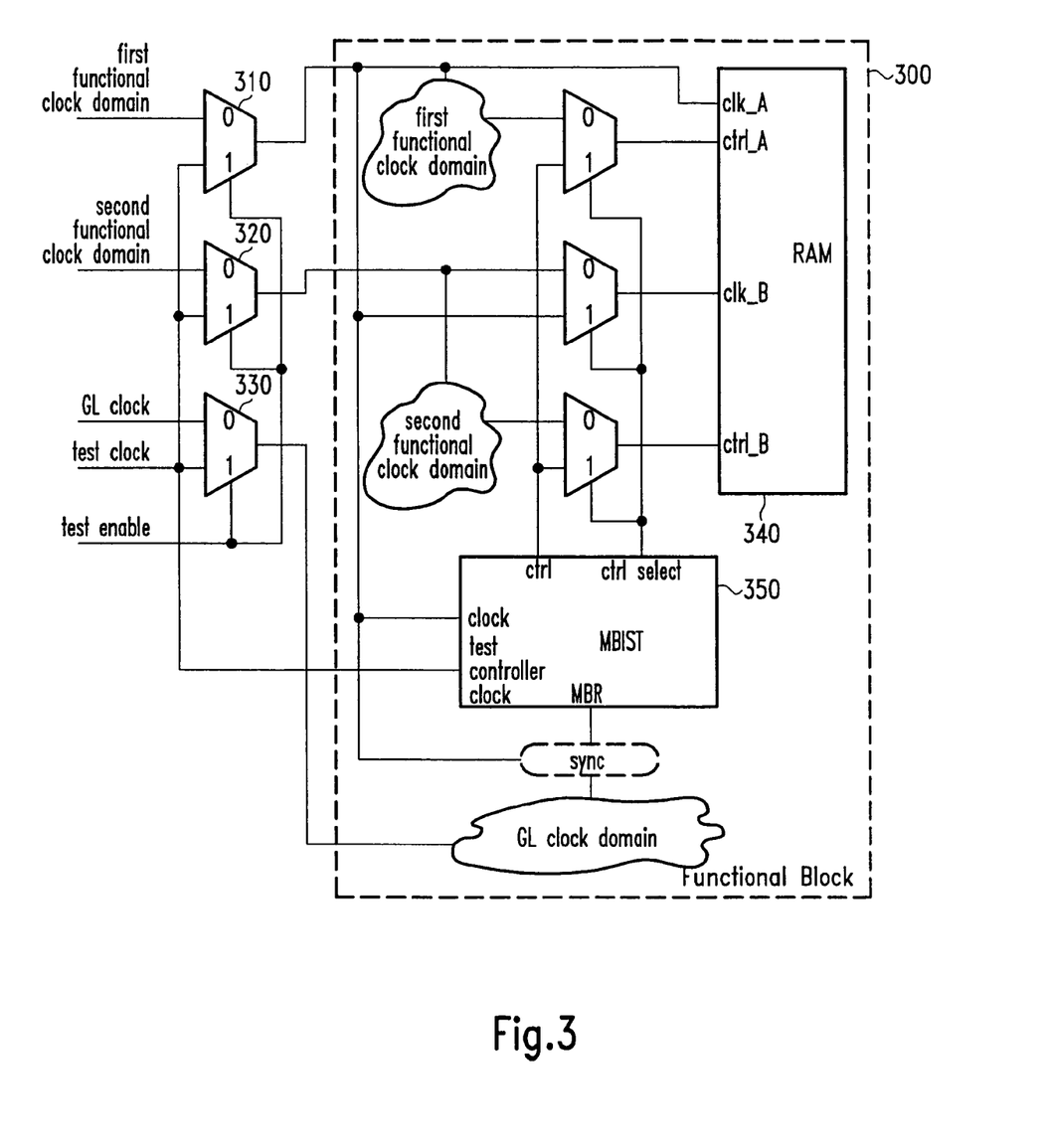
FIG. 3 is a diagram illustrating clock domain handling and clock multiplexing according to an embodiment.

Referring now back to the block diagrams, FIG. 3 is a diagram illustrating the clock domain handling and clock multiplexing. The figure gives an overview on clock domains and clock multiplexing for a system with integrated MBIST. The figure puts the scope on a functional block 300 which instantiates RAM(s) 340 with assigned MBIST(s) 350. Outside this block, either at chip toplevel or within another dedicated block, reside clock multiplexers 310, 320, 330 that select between mission mode and test mode. Not all of these multiplexers might actually be necessary, e.g., when mission mode clock and test clock are fed in from the same primary input of a chip, or the GL (GeodeLink™) clock also drives another functional domain. Nevertheless, from the block's perspective it holds that in test mode, all its clock inputs may carry the same test clock.

For the integration of MBIST controller 100, 350 into a block 300, there may be some consequences. Firstly, there may be no need for clock domain synchronization between the MBIST's functional clock domain and the data register interface within the MBIST core 150 since the data register interface may only be used in test mode and then all clocks are the same anyway. Moreover, the MBIST controller 100 may run with a functional clock that also drives one RAM port. If the RAM has two ports and the other runs off a different clock domain, then a clock multiplexer before the RAM may be necessary (in FIG. 3: the clk_B multiplexer, while in other MBIST instantiations, the controller might be run synchronously to the RAM A side). The control multiplexers for the RAM 340 may switch between mission mode and MBIST mode. Finally, if the GL clock domain is separate from the one that is driving the MBIST 350, the block designer may ensure proper synchronization for the parallel register interface.

As described above, built in algorithms may include MarchB, MATS+, Walking 1/0, SOAF, and SOWM. In addition, there may be a specific stress algorithm that is only applicable to two-port and dual-port RAMs. This algorithm provides a generic way to test two-port and dual-port RAMs of arbitrary bit width/word organization, and it may be used to detect problems in the read amplifier and write logic that only occur when concurrently accessing both sides of the RAM. This algorithm may be used as a complement to other algorithms that check the integrity of the RAM matrix (e.g. MarchB) with specific tests to ensure proper dual-port functionality and detect e.g. bridging faults between the two ports that single-port algorithms cannot detect. In particular, the algorithm may loop through all possible combinations of "toggle to 0", "toggle to 1", "read 0"/"check for 0" and "read 1"/"check for 1" between the regular and opposite port (using addresses with a Hamming distance of 1 between the two ports). By asserting these combinations, the algorithm may check for error conditions that may by caused by RAM power supply problems. Further, for RAMs with two read ports, the algorithm may check concurrent reading from the same address from both sides.

The following is an example algorithm for this mode where M0-M4 denote meta steps and S0-S6 denote steps of the respective meta step. As may be seen, the algorithm can be tailored to RAMs with one of the two ports having only limited capability (type "R_W", "RW_R" and "RW_W"). It is noted that the algorithm makes no assumptions on the internal organization of the RAM and is therefore widely applicable.

Two-Port RAMs: Type "R_W"

Short notation:
M0: {↑(w0)}; M1: {↑.(1a: (w1||r0, r1, w0||r0, r0)}; M2: {↑(w1)};
M3: {↓.(1a: (w0||r1, r0, w1||r1, r1)}
Algorithmic notation:
M0:  for i := 0 to w-1 do
      begin
S0:      write M[i] := {0 . . . 0};
      end M1:  for i := 0 to w-1 do
      begin
         for j := 0 to A-1 do
            begin
S0:            test(portA) on M[i xor (1 << j)] == {0 . . . 0}
                  || write(portB) M[i] :={1 . . . 1};
S1:            test(portA) on M[i] == {1 . . . 1};
S2:            test(portA) on M[i xor (1 << j)] == {0 . . . 0}
                  || write(portB) M[i] := {0 . . . 0};
S3:            test(portA) on M[i] == {0 . . . 0};
            end
      end
M2:  for i := 0 to w-1 do
      begin
S0:      write M[i] := {1 . . . 1};
      end
M3:  for i := w-1 downto 0 do
      begin
         for j := 0 to A-1 do
            begin
S0:            test(portA) on M[i xor (1 << j)] == {1 . . . 1}
                  || write(portB) M[i] :={0 . . . 0};
S1:            test(portA) on M[i] == {0 . . . 0};
S2:            test(portA) on M[i xor (1 << j)] == {1 . . . 1}
                  || write(portB) M[i] := {1 . . . 1};
S3:            test(portA) on M[i] == {1 . . . 1};
            end
      end Dual-Port RAMs: Type "RW_R"

Short notation:
M0: {↑(w0)}; M1: {↑.(1a: (w1||r0, r1||r0, w0||r0, r0||r0), r0||r0};
M2: {↑(w1)}; M3: {↓.(1a: (w0||r1, r0||r1, w1||r1, r1||r1), r1||r1}
Algorithmic notation:
M0:  for i := 0 to w-1 do
      begin
S0:      write M[i] := {0 . . . 0};
      end
M1:  for i := 0 to w-1 do
      begin
         for j := 0 to A-1 do
            begin
S0:            write(portA) M[i] :={1 . . . 1}
                  || test(portB) on M[i xor (i << j)] == {0 . . . 0};
S1:            test(portA) on M[i] == {1 . . . 1}
                  || test(portB) on M[i xor (1 << j)] == {0 . . . 0};
S2:            write(portA) M[i] := {0 . . . 0}
                  || test(portB) on M[i xor (1 << j)] == {0 . . . 0};
S3:            test(portA) on M[i] == {0 . . . 0}
                  || test(portB) on M[i xor (i << j)] == {0 . . . 0};
            end
S4:         test(portA) on M[i] == {0 . . . 0}
               || test(portB) on M[i] == {0 . . . 0};
      end
M2:  for i := 0 to w-1 do
      begin
S0:      write M[i] := {1 . . . 1};
      end
M3:  for i := w-1 downto 0 do
      begin
         for j := 0 to A-1 do
            begin
S0:            write(portA) M[i] :={0 . . . 0}
                  || test(portB) on M[i xor (i << j)] == {1 . . . 1};
S1:            test(portA) on M[i] == {0 . . . 0}
                  || test(portB) on M[i xor (1 << j)] == {1 . . . 1};
S2:            write(portA) M[i] := {1 . . . 1}
                  || test(portB) on M(i xor (1 << j)] == {1 . . . 1};
S3:            test (portA) on M[i] == {1 . . . 1}
                  || test(portB) on M[i xor (1 << j)] == {1 . . . 1};
            end
S4:         test(portA) on M[i] == {1 . . . 1}
               || test(portB) on M[i] == {1 . . . 1};
      end -continued Dual-Port RAMs: Type "RW__W"

Short notation:
M0: {↑(w0)}; M1: {↑.(1a: (w1||w1, r1||w0, w0||w1, r0||w0)};
M2: (↑(w1)};
M3: {↓.(1a: (w0||w0, r0||w1, w1||w0, r1||w1)}
Algorithmic notation:
M0:    for i := 0 to w–1 do
       begin
S0:          write M[i] := {0 ... 0};
       end
M1:    for i := 0 to w–1 do
       begin
          for j := 0 to A–1 do
          begin
S0:              write(portA) M[i] :={1 ... 1}
              || write(portB) M[i xor (1 << j)] == {1 ... 1};
S1:              test(portA) on M[i] == {1 ... 1}
              || write(portB) M[i xor (1 << j)] == {0 ... 0};
S2:              write(portA) M[i] := {0 ... 0}
              || write(portB) M[i xor(1 << j)] == {1 ... 1}
S3:              test(portA) on M[i] == {0 ... 0}
              || write(portB) M[i xor (1 << j)] == {0 ... 0};
          end
       end
M2:    for i := 0 to w–1 do
       begin
S0:          write M[i] := {1 ... 1};
       end
M3:    for 1 := w–1 downto 0 do
       begin
          for j := 0 to A–1 do
          begin
S0:              write(portA) M[i] :={0 ... 0}
              || write(portB) M[i xor (1 << j)] == {0 ... 0};
S1:              test(portA) on M[i] == {0 ... 0}
              || write(portB) M[i xor (1 << j)] == {1 ... 1};
S2:              write(portA) M[i] := {1 ... 1}
              || write(portB) M[i xor (1 << j)] == {0 ... 0};
S3:              test(portA) on M[i] == {1 ... 1}
              || write(portB) M[i xor (1 << j)] == {1 ... 1};
          end
       end Dual-Port RAMs: Type "RW__RW"

Short notation:
M0: {↑(w0)}; M1: {↑.(1a: (w1||r0, r1||w1, w0||r1, r0||w0))};
M2: {↓.(1a: (r0||w1, w1||r1, r1||w0, w0||r0))};
M3: {↑(w1, 1a: (w0||w1, r0||r1, w1||w0, r1||r0), r1||r1, w0)};
M4: {↓.(1a: (w1||w1, r1||r1, w0||w0, r0||r0, r0||r0))};
Algorithmic notation:
M0:    for i := 0 to w–1 do
       begin
S0:          write(port) M[i] := {0 ... 0};
       end
M1:    for i := 0 to w–1 do
       begin
          for j := 0 to A–1 do
          begin
S0:              write(port) M[i] := {1 ... 1}
              || test(~port) on M[i xor (1 << j)] == {0 ... 0};
S1:              test(port) on M[i] == {1 ... 1}
              || write(~port) M[i xor (1 << j)] := {1 ... 1};
S2:              write(port) M[i] := {0 ... 0}
              || test(~port) on M[i xor (1 << j)] == {1 ... 1};
S3:              test(port) on M[i] == {0 ... 0}
              || write(~port) M[i xor (1 << j)] := {0 ... 0};
          end
       end
M2:    for i := w–1 down to 0 do
       begin
          for j := 0 to A–1 do
          begin
S0:              test(port) on M[i] == {0 ... 0}
              || write(~port) M[i xor (1 << j)] := {1 ... 1};
S1:              write(port) M[i] := {1 ... 1}
              || test(~port) on M[i xor (i << j)] == {1 ... 1};
S2:              test(port) on M[i] == {1 ... 1}
              || write(~port) M[i xor (i << j)] := {0 ... 0};

S3:              write(port) M[i] := {0 ... 0}
              || test(~port) on M[i xor (i << j)] == {0 ... 0};
          end
       end
M3:    for i := 0 to w–1 do
       begin
S0:          write(port) M[i] :={1 ... 1};
          for j := 0 to A–1 do
          begin
S1:              write(port) M[i] := {0 ... 0}
              || write(~port) M[i xor (1 << j)] := {1 ... 1};
S2:              test(port) on M[i] == {0 ... 0}
              || test(~port) on M[i xor (1 << j)] == {1 ... 1};
S3:              write(port) M[i] := {1 ... 1}
              || write(~port) M[i xor (1 << j)] := {0 ... 0};
S4:              test(port) on M[i] == {1 ... 1}
              || test(~port) on M(i xor (1 << j)] == {0 ... 0};
          end
S5:          test(port) on M[i] == {1 ... 1}
          || test(~port) on M[i] == {1 ... 1};
S6:          write(port) M[i] := {0 ... 0};
       end
M4:    for 1 := w–1 downto 0 do
       begin
          for j := 0 to A–1 do
          begin
S0:              write(port) M[i] := {1 ... 1}
              || write(~port) M[i xor (i << j)] := {1 ... 1};
S1:              test(port) on M[i] == {1 ... 1}
              || test(~port) on M[i xor (1 << j)] == {1 ... 1};
S2:              write(port) M[i] := {0 ... 0}
              || write(~port) M[i xor (1 << j) ] := {0 ... 0};
S3:              test (port) on M[i] == {0 ... 0}
              || test(~port) on M[i] xor (1 << j)] == {0 ... 0};
          end
S4:          test (port) on M[i] == {0 ... 0}
          || test(~port) on M[i] == {0 ... 0};
       end It is noted that the operations "test(~port) on M[i xor (1<<j)]" will compare read data (and thus potentially lead to a fail) only if (i xor (1<<j))<w (i.e. if the address range is not exceeded). The operations "write(~port) M[i xor (1<<j)]" will be blocked if the address is out of range.

Besides the above-discussed built-in algorithms, there may also be a generic algorithm which is used as a hook to execute non-built in algorithms under test equipment control. It only consists of meta steps with steps to define generic MBIST operations like reading out pattern index values, compare values, increment and decrement addresses, and so on. That is, software stores data into appropriate registers, such as data register 240, and then causes execution of the generic steps and meta steps which make use of the data. This may be a repetitive process. The test functionality depends on the actual data stored.

Figure 4:
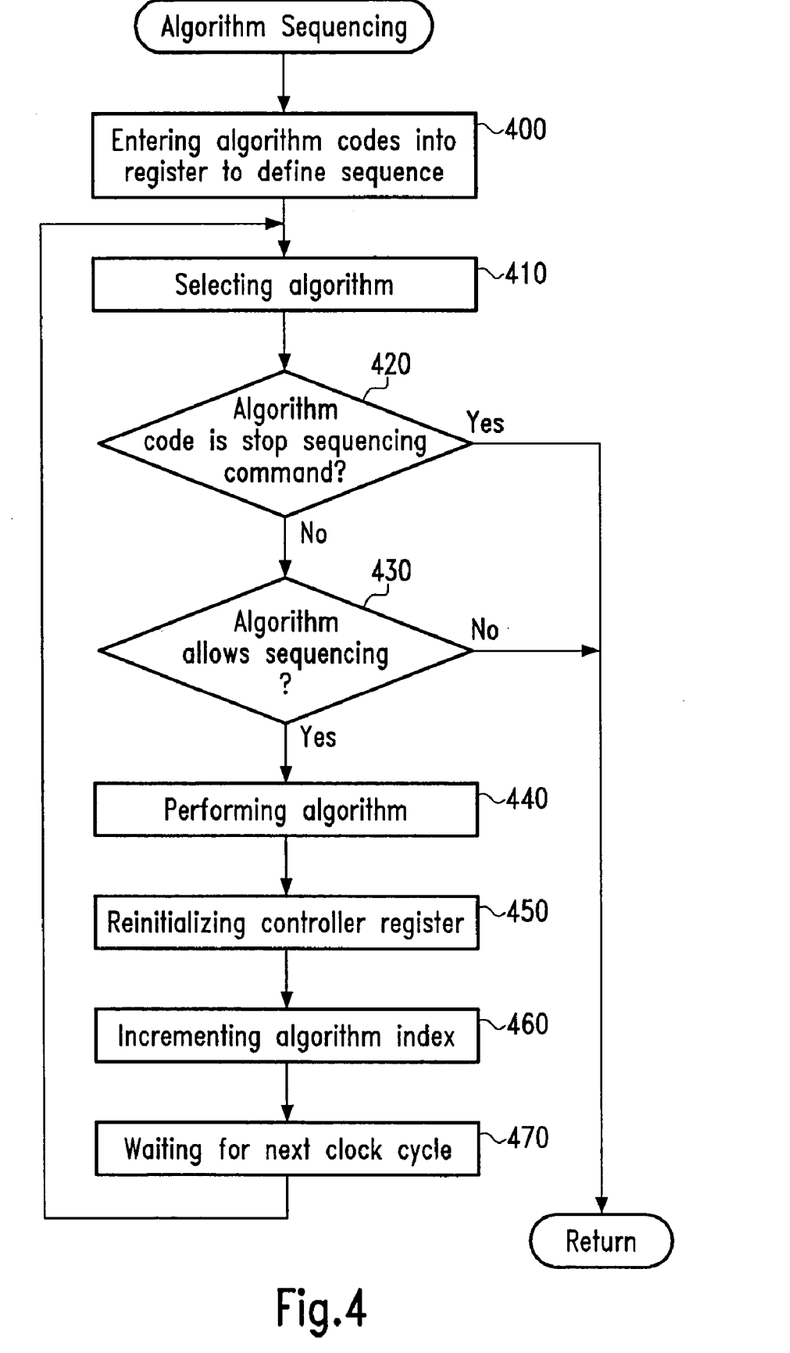
FIG. 4 is a flow chart illustrating the process of algorithm sequencing according to an embodiment.

Referring to FIG. 4, the embodiments may also provide for algorithm sequencing. In order to allow for more comprehensive (and more efficient) tests, the MBIST controller 100 may allow executing a number of algorithms in a sequence. This may be controlled by certain fields in the MBIST state registers. Software may enter the respective algorithm code into the fields for the primary, secondary, etc. algorithms. The current algorithm register 210 may then be used to select the currently executed algorithm.

When the current algorithm is finished without errors, the controller may enter a transitional meta step which may be used to initialize the controller registers for the next algorithm, increment the index of the current algorithm, and commence this next algorithm in the next clock cycle.

In an embodiment, all algorithms except the generic algorithm and a specific NOP (no operation) algorithm code allow sequencing, i.e., can be followed by a next algorithm. For the generic algorithm and NOP, execution will stop after this current algorithm has finished. This may also imply that the first non-sequencing algorithm encountered will terminate the sequence. For example, if the primary algorithm is MarchB, the second is the generic algorithm, and the tertiary is set to MATS+ then only MarchB and Generic will be executed. Algorithm code NOP may be introduced specifically to stop a sequence.

If software wrongly sets the current algorithm register 210 to a value higher than the maximum supported sequence index, this may have the same effect as if setting the respective algorithm to NOP.

Thus, the algorithm sequencing process of FIG. 4 starts with entering algorithm codes into the respective registers to define the sequence in step 400. The first algorithm is then selected in step 410. Step 420 checks whether the algorithm code is NOP. If not, step 430 checks whether the algorithm allows sequencing. If the algorithm is not the generic algorithm (or another non-sequencing algorithm), it is performed in step 440 whereupon the controller registers are reinitialized in step 450 and the algorithm index is incremented in 460. Once the next clock cycle is reached (step 470), the process returns to select the next algorithm.

It should be mentioned that the sequence and order of steps in the flowchart of FIG. 4 has been chosen for explanatory reasons only, and any other step order may be possible as well. For instance, step 460 may be performed prior to step 450, and step 430 prior to step 420. It is even possible to perform these and other steps simultaneously.

It is finally noted that the MBIST controller 100 of the embodiments may be parameterized to connect to genuine two-port RAMs, i.e., RAMs with two independent read/write ports with optional write masks. In this case, port select fields in the state registers may allow to determine which port the respective algorithm is to work on. There may be usually no need to run algorithms that test the matrix' integrity from both sides. Hence the user can control from which side an algorithm is run. However, there may be MBIST algorithms which always exercise both ports (i.e., ignore the setting of the port select field) to ensure proper operation of the address decoder and the write mask logic, respectively.

As described above, embodiments are provided using a plurality of test algorithms including a fault detection test algorithm to perform operational testing in order to detect whether or not there is a memory fault, without locating the memory fault, and a fault location test algorithm to perform operational testing in order to detect and locate a memory fault. It is noted that in an embodiment, the fault detection test algorithm may be adapted to be capable to also locate a memory fault. In this case, execution mode register 265 may be used to specify that this algorithm is applied for fault detection only, not using its fault localization capabilities. In particular, the execution mode register 265 may indicate that read pipelining is active in this case while it was disabled if the algorithm were to be used also for fault location.

As apparent from the above described embodiments, a technique is provided which achieves maximum flexibility in memory testing by allowing built-in self tests which selectively can be restricted to perform nothing more than a go/no go test, or which can be selected to perform a much more sophisticated test including diagnostics, debugging, and single stepping. This reduces any efforts that would have been necessary to be made when employing external test equipment. Further, embodiments which apply the algorithm sequencing technique described above may even combine the advantages of all of the applicable test algorithms by allowing for fast production testing and doing the more time consuming diagnostic tests only if necessary. Moreover, by providing embodiments which apply the generic test mechanisms described above, a technique is provided which is not limited by algorithmic rules and constraints which were defined at the time of circuit development. Rather, new test mechanisms and improved algorithms can be implemented at any later stage just by updating the driving test software. Furthermore, embodiments have been presented which apply a generic way to perform a stress test on dual-port RAMs of arbitrary bit width/word organization. Due to its generic nature this test algorithm may even more improve efficiency and test reliability, and may at the same time achieve maximum applicability to any RAM circuits by substantially making no assumption on the internal organization of the RAMs under test. Finally, it is noted that all of the embodiments described above can be provided in the form of a template so that the circuit designer and system developer is given a powerful tool to implement sophisticated mechanisms without raising overwhelmingly cumbersome design issues.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention. In addition, those areas in which it is believed that those of ordinary skill in the art are familiar, have not been described herein in order to not unnecessarily obscure the invention described herein. Accordingly, it is to be understood that the invention is not to be limited by the specific illustrative embodiments, but only by the scope of the appended claims.

What is claimed is:

1. An integrated circuit chip comprising:
on-chip memory; and
test circuitry configured to perform operational testing of said on-chip memory,
wherein said test circuitry comprises a controller configured to perform a selection out of a plurality of test algorithms to perform said operational testing,
wherein said plurality of test algorithms include a fault detection test algorithm to perform operational testing of said on-chip memory in order to detect whether or not there is a memory fault, without locating the memory fault,
wherein said plurality of test algorithms further include a fault location test algorithm to perform operational testing of said on-chip memory in order to detect and locate a memory fault;
wherein said plurality of test algorithms comprise at least one dual-port RAM (Random Access Memory) test algorithm configured to assert all combinations of "toggle to 0", "toggle to 1", "read 0" and "read 1" in concurrent accesses to both ports, wherein said at least one dual-port RAM test algorithm includes an algorithm for RAM devices having two read-ports, said algorithm being configured to concurrently read from same addresses from both read-ports.

2. The integrated circuit chip of claim 1, wherein said on-chip memory is an embedded memory only accessible from within the integrated circuit chip.

3. The integrated circuit chip of claim 1, wherein said controller is further configured to perform algorithm sequencing by performing at least one fault detection test algorithm and at least one fault location test algorithm in a software configurable order.

4. The integrated circuit chip of claim 1, wherein said plurality of test algorithms comprise a generic algorithm having algorithmic functionality defined in run time by software.

5. The integrated circuit chip of claim 1, wherein at least one of said plurality of test algorithms is configured to perform pipelined reading.

6. The integrated circuit chip of claim 1, wherein said fault location test algorithm is configured to perform a repair step upon fault detection, and then resume the algorithm, said repair step writing an expected value to a failed location.

7. The integrated circuit chip of claim 1, wherein said controller comprises registers for storing control data used by the controller to control said operational testing, said registers being readable and writeable by software via at least one interface.

8. The integrated circuit chip of claim 1, further comprising a bypass connected to forward on-chip memory input signals to said controller.

9. The integrated circuit chip of claim 1, capable of handling at least two clock domains, and further comprising at least one clock multiplexer to select between mission mode and test mode.

10. A method to perform a memory built-in self test, comprising:
   receiving an algorithm code identifying one of plural built-in self test algorithms, said plural built-in self test algorithms including at least one go/no go production test algorithm and at least one fault analysis algorithm;
   determining the algorithm identified by the received algorithm code;
   if it is determined that the received algorithm code identifies a go/no go production test algorithm, performing the identified go/no go production test algorithm; and
   if it is determined that the received algorithm code identifies a fault analysis algorithm, performing the identified fault analysis algorithm;
   wherein said plural built-in self test algorithms further include at least one dual-port RAM (Random Access Memory) test algorithm configured to loop through all possible combinations of "toggle to 0", "toggle to 1", "read 0" and "read 1" between both ports, wherein said at least one dual-port RAM test algorithm includes an algorithm for RAM devices having two read-ports, said algorithm being configured to concurrently read from same addresses from both read-ports.

11. The method of claim 10, further comprising:
   receiving a second algorithm code identifying a second one of said plural built-in self test algorithms;
   storing the received algorithm code and the received second algorithm code in a register, thereby defining an order of the identified algorithms; and
   performing an algorithm sequence comprising the identified algorithm and the identified second algorithm in the order defined.

12. The method of claim 11, wherein performing the algorithm sequence comprises:
   for each algorithm to be performed, determining whether the algorithm is allowed to be performed in the algorithm sequence, and if not, suppressing performing the algorithm.

13. The method of claim 10, wherein said plural built-in self test algorithms further include a generic algorithm having algorithmic functionality defined in run time by software.

14. The method of claim 10, wherein at least one of said plural built-in self test algorithms is configured to perform pipelined reading.

15. The method of claim 10, wherein at least one of said at least one fault analysis algorithm is configured to perform a repair step upon fault detection, and then resume the algorithm, said repair step writing an expected value to a failed location.

* * * * *

UNITED STATES PATENT AND TRADEMARK OFFICE
CERTIFICATE OF CORRECTION

PATENT NO.       : 7,653,845 B2                                   Page 1 of 1
APPLICATION NO.  : 11/484157
DATED            : January 26, 2010
INVENTOR(S)      : Hesse et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 616 days.

Signed and Sealed this

Twenty-third Day of November, 2010

David J. Kappos
*Director of the United States Patent and Trademark Office*